US012701684B2

(12) United States Patent
Park et al.

(10) Patent No.: US 12,701,684 B2
(45) Date of Patent: Aug. 4, 2026

(54) WATER HEATER AND METHOD FOR CONTROLLING THE SAME

(71) Applicant: LG ELECTRONICS INC., Seoul (KR)

(72) Inventors: Hansaem Park, Seoul (KR); Byeongsu Kim, Seoul (KR); Jungmin Park, Seoul (KR); Hojin Seo, Seoul (KR); Junyoung Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 99 days.

(21) Appl. No.: 18/629,233

(22) Filed: Apr. 8, 2024

(65) Prior Publication Data

US 2025/0159850 A1     May 15, 2025

(30) Foreign Application Priority Data

Nov. 13, 2023     (KR) ........................ 10-2023-0156807

(51) Int. Cl.
*H05K 7/20*          (2006.01)
*F24H 1/08*          (2022.01)
*F24H 15/31*         (2022.01)

(52) U.S. Cl.
CPC ......... *H05K 7/20945* (2013.01); *F24H 15/31* (2022.01); *F24H 1/08* (2013.01)

(58) Field of Classification Search
CPC ......... H05K 7/20945; F24H 1/08; F24H 4/02; F25B 5/04; F25B 2339/047; F25B 5/02; F25B 41/42; F24D 17/02; F24F 1/24

USPC ......................................................... 165/287
See application file for complete search history.

(56) References Cited

U.S. PATENT DOCUMENTS

| | | | |
|---|---|---|---|
| 2015/0077939 A1 | 3/2015 | Lee et al. | |
| 2021/0018234 A1* | 1/2021 | Lingrey | F25B 41/26 |
| 2021/0262708 A1* | 8/2021 | Ryu | F25B 25/005 |
| 2021/0291626 A1 | 9/2021 | Makimoto et al. | |
| 2022/0268499 A1 | 8/2022 | Yamaguchi et al. | |
| 2022/0325930 A1* | 10/2022 | Day | B60H 1/00907 |
| 2022/0412623 A1* | 12/2022 | Houdek | F25B 41/325 |

FOREIGN PATENT DOCUMENTS

| | | |
|---|---|---|
| EP | 4 027 073 A1 | 7/2022 |
| JP | 6300393 B2 | 3/2018 |
| KR | 10-2128584 B1 | 6/2020 |

* cited by examiner

*Primary Examiner* — Steve S Tanenbaum
(74) *Attorney, Agent, or Firm* — Birch, Stewart, Kolasch & Birch, LLP

(57) ABSTRACT

A water heater and a method for controlling the same are provided. The water heater may include a compressor and a condenser disposed on an outlet side of the compressor and configured to perform heat exchange with water and may constitute a branch passage by branching an outlet-side passage of the condenser, and a cooling unit of an electronic component unit may be constituted in the branch passage. The temperature of the refrigerant introduced into the cooling unit may be lowered by installing a cooling expansion device on an inlet side of the cooling unit of the electronic component unit. With this configuration, the cooling of the electronic component unit by the cooling unit may be performed efficiently.

15 Claims, 9 Drawing Sheets

FIG. 6

WATER HEATER AND METHOD FOR CONTROLLING THE SAME

CROSS-REFERENCE TO RELATED APPLICATIONS

The present application claims priority under 35 U.S.C. 119 and 35 U.S.C. 365 to Korean Patent Application No. 10-2023-0156807 (filed on Nov. 13, 2023), which is hereby incorporated by reference in its entirety.

BACKGROUND

The present disclosure relates to a water heater and a method for controlling the same.

DESCRIPTION OF RELATED ART

A heat pump system is a system that acquires a predetermined amount of heat from a heat source and uses the acquired heat to cool or heat a place of use or supply hot water to a place of use.

In particular, the heat pump system may include an outdoor unit that drives a cooling cycle, and a water heater connected to the outdoor unit. The water heater may be configured to receive a heat source by exchanging heat with a refrigerant of the outdoor unit and supply hot water by exchanging heat with water transferred from a place of use.

On the other hand, the water heater may include an electronic component unit provided with a plurality of control components. A lot of heat may be generated in the electronic component unit. As an example, the heating temperature of the electronic component unit may be approximately 70° C. to 80° C.

When the electronic component unit is not sufficiently cooled, there may occur a problem in that the control components malfunction. To solve this problem, a method for cooling an electronic component unit by using a refrigerant circulating through a water heater may be considered.

However, when high-temperature hot water has to be supplied to a place of use, a water heater needs to be provided with a condenser whose heat exchange temperature (condensation temperature) is approximately 70° C. When the electronic component unit is cooled by using the refrigerant that has passed through the high-temperature condenser, the cooling effect of the electronic component unit may be minimal or non-existent.

Therefore, in a water heater that has to supply high-temperature hot water, there is a need to develop a refrigerant cooling structure for an electronic component unit provided in the water heater.

SUMMARY

An object of the present disclosure is to provide a water heater capable of efficiently cooling an electronic component unit by using a refrigerant cooling method.

An object of the present disclosure is to provide a water heater that lowers a temperature of a refrigerant by depressurizing a refrigerant that has passed through a high-temperature water refrigerant heat exchanger, and then cooling an electronic component unit, thereby improving the cooling efficiency of the electronic component unit.

An object of the present disclosure is to provide a water heater capable of adjusting a temperature of a refrigerant used for cooling an electronic component unit based on a temperature of the electronic component unit.

An object of the present disclosure is to provide a water heater in which a supercooler is installed on an outlet side of a condenser and an electronic component unit is efficiently cooled by using a refrigerant cooled while passing through the supercooler.

An object of the present disclosure is to provide a water heater capable of efficiently cooling an electronic component unit by using a heat source of a refrigerant circulating through an outdoor unit.

An object of the present disclosure is to provide a water heater in which an additional heat exchanger is installed on an outlet side of a condenser and exchanges heat between a refrigerant of an outdoor unit and a condensed refrigerant of the water heater, thereby efficiently cooling an electronic component unit.

A water heater according to an embodiment of the present disclosure may include a compressor and a condenser disposed on an outlet side of the compressor and configured to perform heat exchange with water and may constitute a branch passage by branching an outlet-side passage of the condenser, and a cooling unit of an electronic component unit may be constituted in the branch passage.

The temperature of the refrigerant introduced into the cooling unit may be lowered by installing a cooling expansion device on an inlet side of the cooling unit of the electronic component unit. With this configuration, the cooling of the electronic component unit by the cooling unit may be performed efficiently.

The temperature of the electronic component unit may be detected, and the flow rate of the refrigerant flowing to the cooling unit may be adjusted by adjusting the opening degree of the cooling expansion device based on the detected temperature of the electronic component unit.

The refrigerant in the branch passage may be joined with the refrigerant in the main passage at the outlet side of the main expansion device, and the joined refrigerant may be introduced into the evaporator while forming a low pressure.

As another example, a supercooler may be installed in the outlet-side passage of the condenser, and the cooling unit of the electronic component unit may be configured in the branch passage connected to the supercooler.

The temperature of the refrigerant introduced into the cooling unit may be lowered by installing a supercooling expansion device in the branch passage. With this configuration, the cooling of the electronic component unit by the cooling unit may be performed efficiently.

As another example, an additional heat exchanger may be installed in the outlet-side passage of the condenser.

The additional heat exchanger may include a first heat exchange passage through which the refrigerant of the outdoor unit flows and a second heat exchange passage through which the condensed refrigerant of the water heater flows, and may constitute the cooling unit of the electronic component unit in the outlet-side passage of the second heat exchange passage.

A main expansion device may be installed in the outlet-side passage of the cooling unit of the electronic component unit, and the refrigerant that has cooled the electronic component unit in the cooling unit may be depressurized in the main expansion device and then introduced into the evaporator.

According to an aspect of the present disclosure, a water heater connected to an outdoor unit including an outdoor heat exchanger that exchanges heat with air through first and second refrigerant lines and connected to a hot water use place to supply hot water, and including an electronic component unit provided with control components.

The water heater may include a compressor configured to compress a refrigerant, a condenser provided on an outlet side of the compressor and configured to perform heat exchange between a refrigerant passage through which a refrigerant compressed in the compressor flows and a water passage through which water transferred from the hot water use place flows, a condenser outlet pipe extending from an outlet side of the condenser, a cooling unit installed in the condenser outlet pipe and configured to supply a refrigerant so as to cool the electronic component unit, and an evaporator disposed on an outlet side of the cooling unit and configured to perform heat exchange between a first refrigerant passage through which a refrigerant passing through the cooling unit flows and a second refrigerant passage through which a refrigerant transferred from the outdoor unit flows.

The cooling unit may be installed on a passage through which at least a portion of the refrigerant flowing through the condenser outlet pipe branches and flows.

The condenser outlet pipe may include a branch portion, and the cooling unit may be installed in a branch pipe branched from the branch portion.

A branch expansion valve may be installed in the branch pipe so as to depressurize a refrigerant flowing through the branch pipe, and the branch expansion valve comprises an electric expansion valve that allows an opening degree to be adjusted.

The water heater may further include an electronic component unit temperature sensor configured to detect a temperature of the electronic component unit, and a controller configured to adjust the opening degree of the branch expansion valve based on the temperature detected by the electronic component unit temperature sensor.

The controller may be configured to increase the opening degree of the branch expansion valve when the controller recognizes that the temperature detected by the electronic component unit temperature sensor changes to increase, and to decrease the opening degree of the branch expansion valve when the controller recognizes that the temperature detected by the electronic component unit temperature sensor changes to decrease.

The condenser outlet pipe may further include a joining portion where the branch pipe is joined, and the condenser outlet pipe may be provided with a main expansion valve for depressurizing the refrigerant at a point between the branch portion and the joining portion.

The water heater may further include a supercooler installed in the condenser outlet pipe and a supercooling passage branched from the condenser outlet pipe and connected to the supercooler, and the cooling unit may be installed on the supercooling passage at an outlet side of the supercooler.

The water heater may further include a supercooler installed in the condenser outlet pipe and a supercooling passage branched from the condenser outlet pipe and connected to the supercooler, and the cooling unit may be installed on the supercooling passage at an outlet side of the supercooler.

The water heater may further include an electronic component unit temperature sensor configured to detect a temperature of the electronic component unit, and a controller configured to adjust the opening degree of the supercooling expansion valve based on the temperature detected by the electronic component unit temperature sensor.

The controller may be configured to increase the opening degree of the supercooling expansion valve when the controller recognizes that the temperature detected by the electronic component unit temperature sensor changes to increase, and to decrease the opening degree of the supercooling expansion valve when the controller recognizes that the temperature detected by the electronic component unit temperature sensor changes to decrease.

The water heater may further include a supercooling temperature sensor installed in the condenser outlet pipe, wherein the controller may be configured to calculate a supercooling degree based on the temperature of the supercooling temperature sensor when the controller recognizes that the temperature detected by the electronic component unit temperature sensor is higher than or equal to a reference temperature, and to perform control to close the supercooling expansion valve when the supercooling degree is greater than or equal to a predetermined supercooling degree.

The condenser outlet pipe may further include a joining portion where the supercooling passage is joined, and the condenser outlet pipe may be provided with a main expansion valve for depressurizing the refrigerant at a point between the supercooler and the joining portion.

The water heater may further include an additional heat exchanger installed in the condenser outlet pipe, and the additional heat exchanger may include a first heat exchange portion connected to the condenser outlet pipe and a second heat exchange portion connected to the second refrigerant passage of the evaporator and configured to exchange heat with the first heat exchange portion.

The water heater may further include an evaporator outlet passage extending from an outlet side of the second refrigerant passage of the evaporator to the second heat exchange portion of the additional heat exchanger, and an evaporator-side expansion valve may be installed in the evaporator outlet passage so as to depressurize the refrigerant introduced into the second heat exchange portion.

The water heater may further include an electronic component unit temperature sensor configured to detect a temperature of the electronic component unit, and a controller configured to adjust an opening degree of the evaporator-side expansion valve based on the temperature detected by the electronic component unit temperature sensor, wherein the controller may be configured to decrease the opening degree of the evaporator-side expansion valve when the controller recognizes that the temperature detected by the electronic component unit temperature sensor changes to increase, and to increase the opening degree of the evaporator-side expansion valve when the controller recognizes that the temperature detected by the electronic component unit temperature sensor changes to decrease.

The cooling unit may be connected to an outlet side of the first heat exchange portion of the additional heat exchanger, and a main expansion valve for depressurizing the refrigerant may be installed on an outlet side of the cooling unit.

According to another aspect of the present disclosure, a method for controlling a water heater is a method for controlling a water heater connected to an outdoor unit including an outdoor heat exchanger that exchanges heat with air through first and second refrigerant lines and connected to a hot water use place to supply hot water, and including an electronic component unit provided with control components.

The method may include detecting a temperature of the electronic component unit, recognizing whether the detected temperature of the electronic component unit is higher than or equal to a reference temperature, and when the detected temperature of the electronic component unit is higher than or equal to the reference temperature, adjusting an amount of refrigerant flowing through a cooling pipe coupled to the electronic component unit.

The water heater may further include a compressor and a condenser, and the adjusting of the amount of refrigerant may include adjusting an amount of refrigerant in a branch pipe branched from an outlet pipe of the condenser and connected to the cooling pipe by using an opening degree of a branch expansion valve.

The water heater may further include a compressor, a condenser, and a supercooler provided on an outlet side of the condenser, and the adjusting of the amount of refrigerant may include adjusting an amount of refrigerant in a supercooling passage branched from an outlet pipe of the condenser and connected to the supercooler by using an opening degree of a supercooling expansion valve.

The water heater may further include a compressor, a condenser, and an additional heat exchanger provided on an outlet side of the condenser and configured to perform heat exchange between a first refrigerant passage of a refrigerant passing through the condenser and a second refrigerant passage of a refrigerant transferred from the outdoor unit, and the adjusting of the amount of refrigerant may include adjusting an amount of refrigerant introduced into the second refrigerant passage by using an opening degree of an evaporator-side expansion valve.

BRIEF DESCRIPTION OF THE DRAWINGS

FIG. 6 is a cycle diagram showing a configuration of a water heater according to a second embodiment of the present disclosure.

DETAILED DESCRIPTION OF THE EMBODIMENTS

Figure 1:
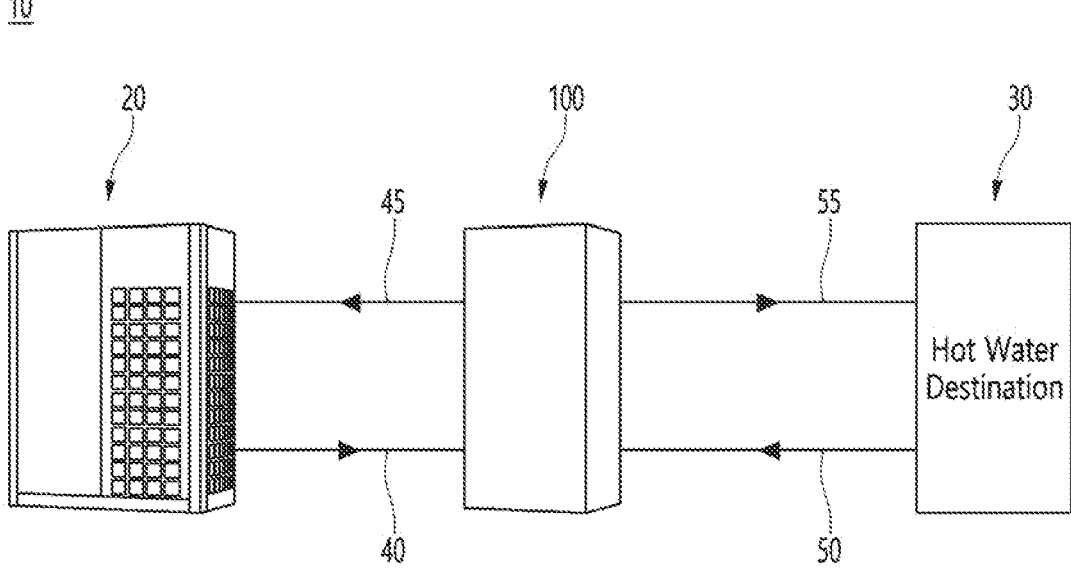
FIG. 1 is a schematic diagram showing a configuration of a heat pump system according to an embodiment of the present disclosure.

Hereinafter, some embodiments of the present disclosure will be described in detail with reference to exemplary drawings. In assigning reference numerals to elements of the drawings, it should be noted that the same elements are denoted by the same reference numerals as much as possible even though the same elements are illustrated in different drawings. In addition, in describing the embodiments of the present disclosure, if the detailed description of the relevant known functions or configurations is determined to unnecessarily obscure the gist of the present disclosure, the detailed description thereof is omitted.

In addition, the terms, such as "first", "second", "A", "B", "(a)", or "(b)" may be used herein to describe the components of the present disclosure. These terms are only for distinguishing one element from another, and the essence, order, or sequence of the elements is not limited by the terms. When one component is described as being "connected", "coupled", or "linked" to another component, the component may be directly connected or coupled to the other component, but it should be understood that another component may be "connected", "coupled" or "linked" between components.

Figure 2:
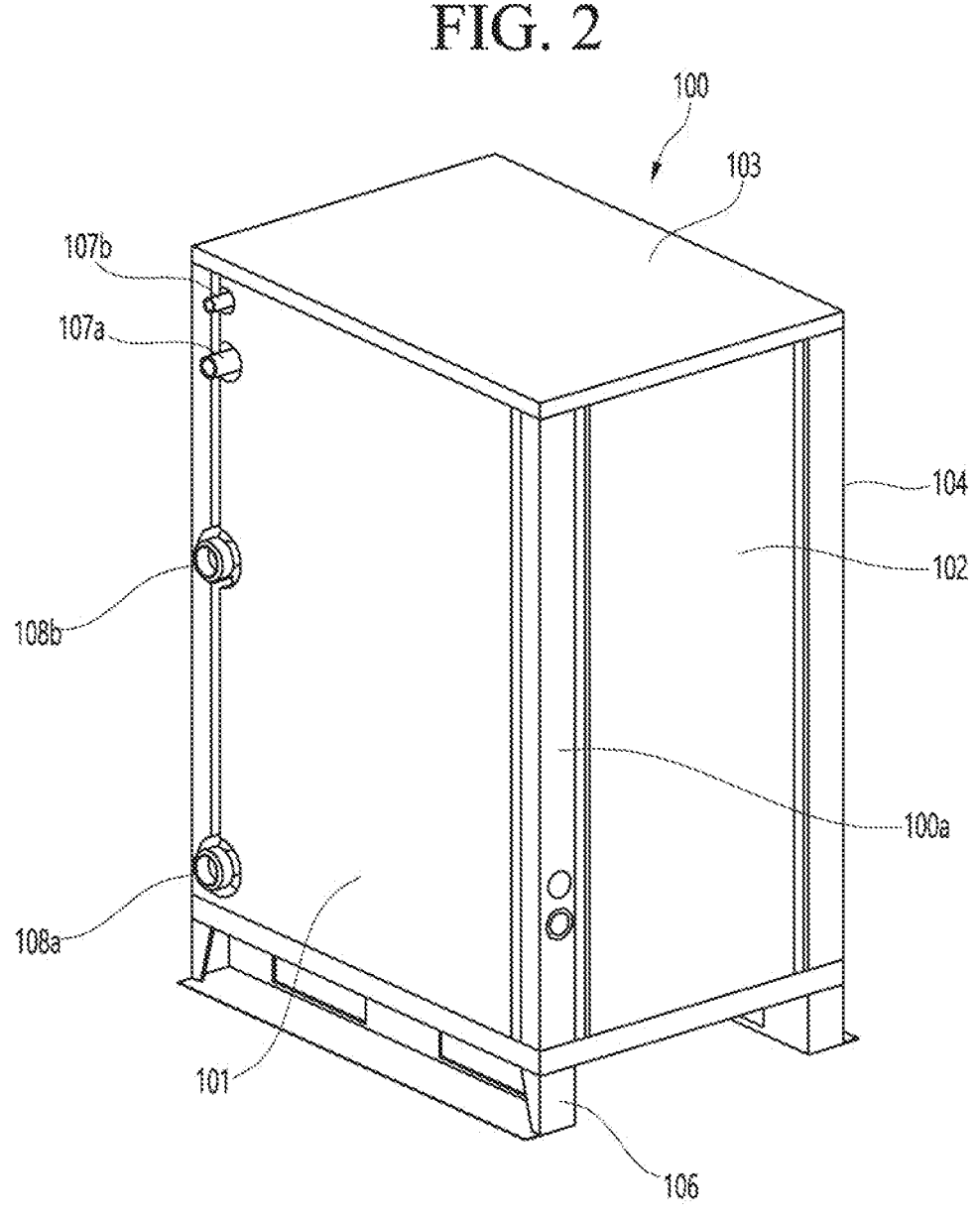
FIG. 2 is a perspective view showing an outer appearance of a water heater according to an embodiment of the present disclosure.
Figure 3:
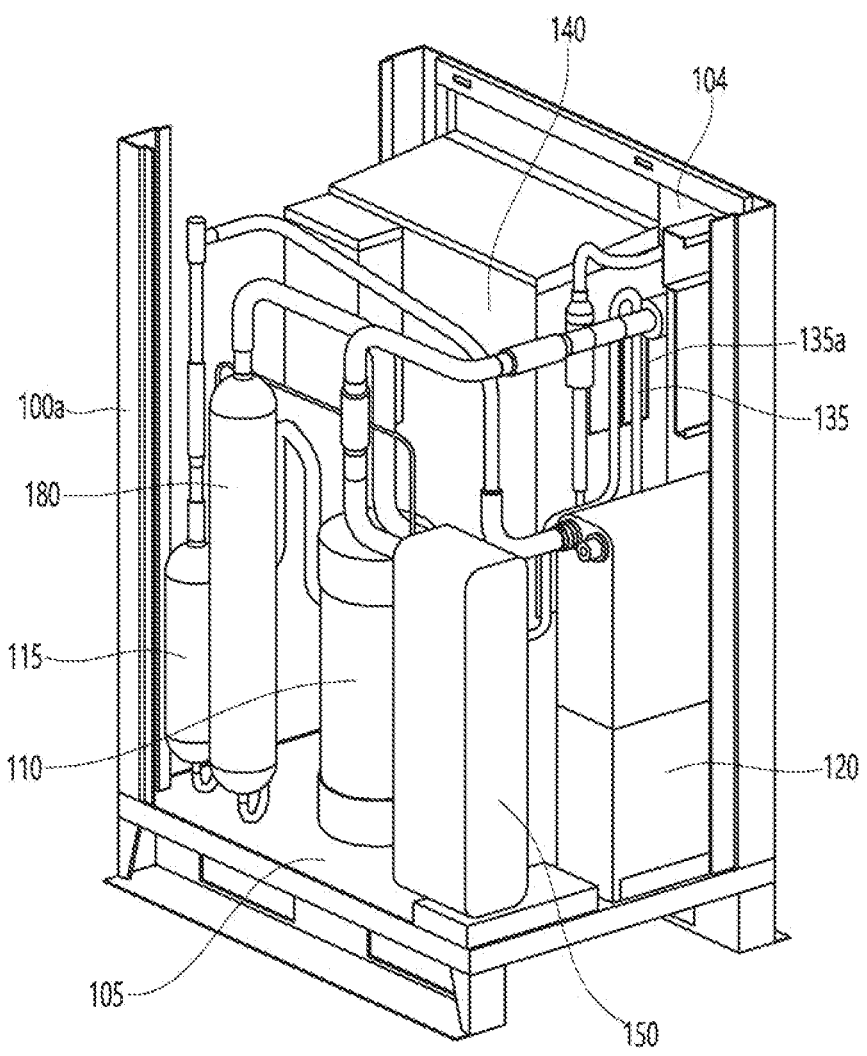
FIG. 3 is a perspective view showing the internal configuration of the water heater according to an embodiment of the present disclosure.

FIG. 1 is a schematic diagram showing a configuration of a heat pump system according to an embodiment of the present disclosure, FIG. 2 is a perspective view showing an outer appearance of a water heater according to an embodiment of the present disclosure, and FIG. 3 is a perspective view showing the internal configuration of the water heater according to an embodiment of the present disclosure.

Referring to FIG. 1, a heat pump system 10 according to an embodiment of the present disclosure may include an outdoor unit 20 that exchanges heat with outdoor air. For example, the outdoor unit 20 may be installed on the rooftop of a building (place of use).

The outdoor unit 20 may include a plurality of components for driving a refrigerant cycle. In detail, the outdoor unit 20 may include an outdoor compressor, an outdoor heat exchanger, and an outdoor expansion valve. Since the configuration of such a general outdoor unit is related to known technology, a detailed description thereof is omitted herein.

The heat pump system 10 may further include a water heater 100 including a heat exchanger that exchanges heat with a refrigerant circulating through the outdoor unit 20.

A first refrigerant line 40 that guides the refrigerant of the outdoor unit 20 toward the water heater 100 and a second refrigerant line 45 that is connected to the first refrigerant line 40 and guides the refrigerant, the heat of which is-exchanged with the refrigerant of the water heater 100, toward the outdoor unit 20 may be provided between the outdoor unit 20 and the water heater 100.

The first and second refrigerant lines 40 and 45 connect the outdoor unit 20 to the water heater 100, and the refrigerant of the outdoor unit 20 exchanges heat with the refrigerant of the water heater 100, such that the water heater 100 may receive a heat source for generating hot water from the outdoor unit 20.

The heat pump system 10 may further include a hot water use place 30 that receives hot water by using a refrigerant heat source of the water heater 100. The hot water use place 30 may be understood as a place where the heat pump system is used.

The water heater 100 may include a water refrigerant heat exchanger that performs heat exchange between the refrigerant circulating through the water heater 100 and water supplied from the hot water use place 30. The water refrigerant heat exchanger may constitute a condenser in the refrigeration cycle that constitutes the water heater 100.

A first water line 50 that guides the water from the hot water use place 30 toward the water heater 100 and a second water line 55 that is connected to the first water line 50 and guides the water, the heat of which is exchanged with the refrigerant of the water heater 100, toward the hot water use place 30 may be provided between the water heater 100 and the hot water use place 30.

The first and second water lines 50 and 55 connect the water heater 100 to the hot water use place 30, and the refrigerant of the water heater 100 exchanges heat with the water of the hot water use place 30, such that the hot water use place 30 may receive hot water from the water heater 100.

Referring to FIGS. 2 and 3, the water heater 100 according to an embodiment of the present disclosure may include a main body that forms an outer appearance.

The main body may include a front panel 101, side panels 102 on both sides, a top panel 103, and a rear panel 104. These panels may be assembled to form the outer appearance of the main body. As an example, the main body may have a hexahedral shape.

Brackets 100a may be provided at the corners of the panels. The brackets 100a may each be provided between two adjacent panels and may have a bar shape extending in the vertical direction. The two adjacent panels may be coupled to each other with the bracket 100a therebetween.

The lower portion of the main body may include a base 105 on which a plurality of components provided in the water heater 100 are installed. The base 105 may form the bottom surface of the main body.

The lower side of the base 105 may further include a leg 106 placed on the ground.

The plurality of components may constitute components of a cooling cycle constituting the water heater 100.

The plurality of components may include a compressor 110, an oil separator 115, a condenser 120, an evaporator 150, and a gas-liquid separator 180.

An electronic component unit 140 including a plurality of control components for controlling the operation of the water heater 100 may be installed inside the main body. The electronic component unit 140 may include an electronic component case that forms the outer appearance.

The plurality of control components may include heating components that are disposed on an electronic component board and generate high-temperature heat.

For example, the heating components may include a power module (intelligent power module (IPM)). The IPM is understood as a module on which a driving circuit of a power device such as a power metal-oxide semiconductor field effect transistor (MOSFET) or an insulated gate bipolar transistor (IGBT) for controlling power and a protection circuit with a self-protection function are installed. When the power module is driven, high-temperature heat of approximately 80° C. or higher may be generated due to an on/off operation of a switching element provided in the power module.

In addition, the heating components may further include a microcomputer, an inverter, a converter, an electrically erasable programmable read-only memory (EEPROM), a rectifier diode, or a condenser.

A refrigerant pipe that guides the refrigerant flow of the water heater 100 may be further provided inside the main body. At least a portion of the refrigerant pipe may constitute a cooling unit 135 of the electronic component unit 140. The cooling unit 135 of the electronic component unit 140 may be referred to as a "cooling pipe."

The cooling unit 135 may be coupled to one side of the electronic component unit 140, that is, one side of the electronic component case. For example, a heat sink 135a may be provided on one side of the electronic component unit 140, and the cooling unit 135 may be coupled to the heat sink 135.

The refrigerant with a lower temperature than the electronic component unit 140 may flow in the cooling unit 135, and the low-temperature refrigerant may emit heat from the electronic component unit 140 through the heat sink 135.

The water heater 100 may include a plurality of ports.

The plurality of ports may include two ports 107a and 107b to which the first and second refrigerant lines 40 and 45 of the outdoor unit 20 are connected. The two ports may be refrigerant ports.

The two ports 107a and 107b may include a refrigerant inlet port 107a to which the first refrigerant line 40 is connected. The refrigerant of the outdoor unit flowing through the first refrigerant line 40 may be introduced into the main body through the refrigerant inlet port 107a.

Figure 4:
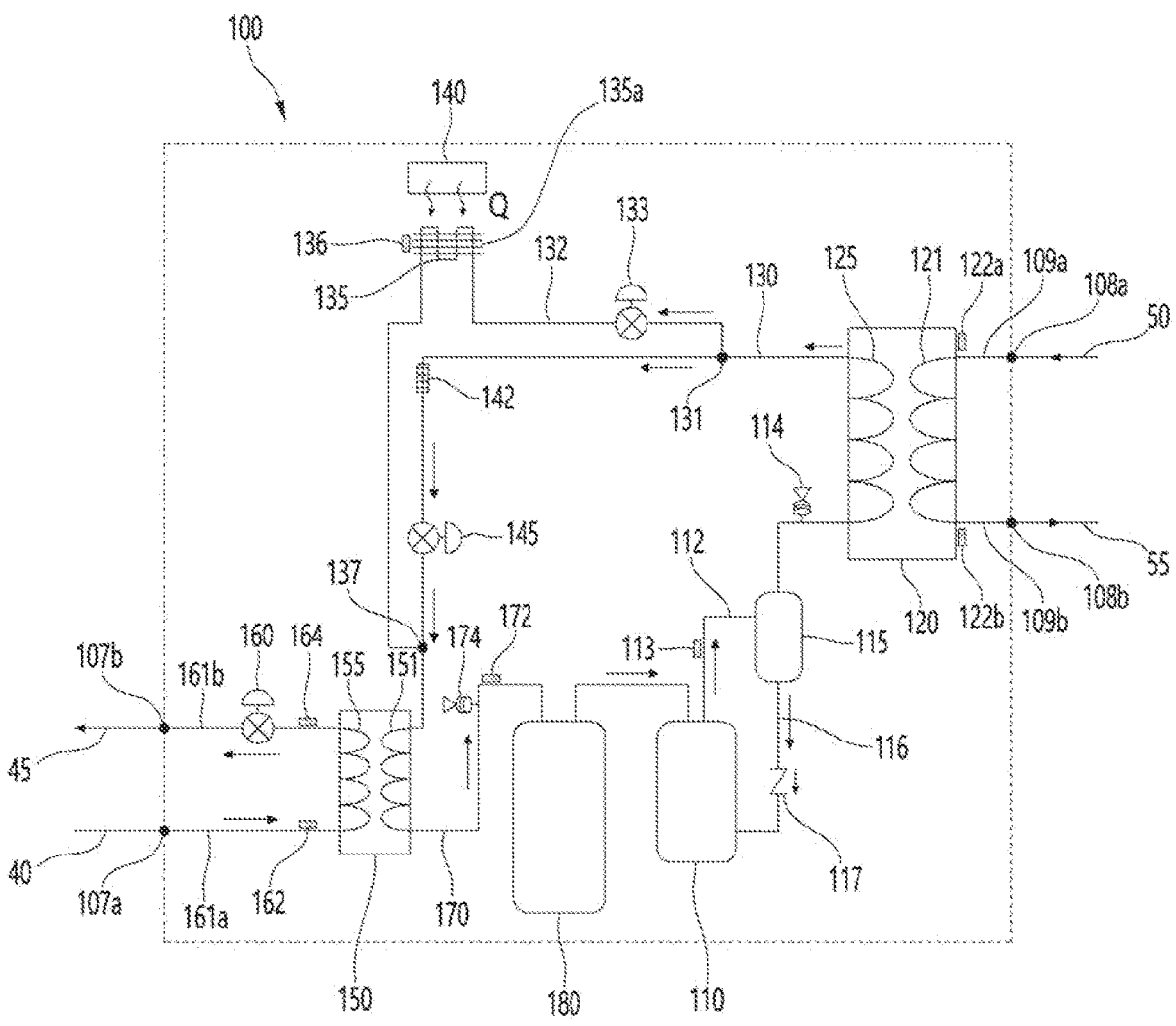
FIG. 4 is a cycle diagram showing a configuration of a water heater according to a first embodiment of the present disclosure.

The refrigerant introduced through the refrigerant inlet port 107a may be introduced into the evaporator 150 through an evaporator inlet passage (see 161a of FIG. 4).

The two ports 107a and 107b may include a refrigerant outlet port 107b to which the second refrigerant line 45 is connected.

An evaporator outlet passage (see 161b of FIG. 4) may be connected to the refrigerant outlet port 107b. The evaporator outlet passage 161b may extend from the evaporator 150 to the refrigerant outlet port 107b. The refrigerant of the outdoor unit, which has exchanged heat with the refrigerant of the water heater 100 in the evaporator 150, may be discharged from the refrigerant outlet port 107b through the evaporator outlet passage 161b.

The refrigerant discharged from the refrigerant outlet port 107b may be returned to the outdoor unit 20 through the second refrigerant line 45.

The plurality of ports provided in the main body may include two ports 108a and 108b to which the first and second water lines 50 and 55 of the hot water use place 30 are connected. The two ports may be male ports.

The two ports 108a and 108b may include a water inlet port 108a to which the first water line 50 is connected. The water of the hot water use place 30 flowing through the first water line 50 may be introduced into the main body through the water inlet port 108a.

The water introduced through the water inlet port 108a may be introduced into the condenser 120 through a condenser inlet passage (see 109a of FIG. 4).

The two ports 108a and 108b may include a water outlet port 108b to which the second water line 55 is connected.

A condenser outlet passage (see 109b of FIG. 4) may be connected to the water outlet port 108b. The condenser outlet passage 109b may extend from the condenser 120 to the water outlet port 108b. The water, the heat of which is exchanged with the refrigerant of the water heater 100 in the condenser 120, may be discharged from the water outlet port 108b through the condenser outlet passage 109b.

The refrigerant discharged from the water outlet port 108b may be supplied to the hot water use place 30 through the second water line 55.

Figure 5:
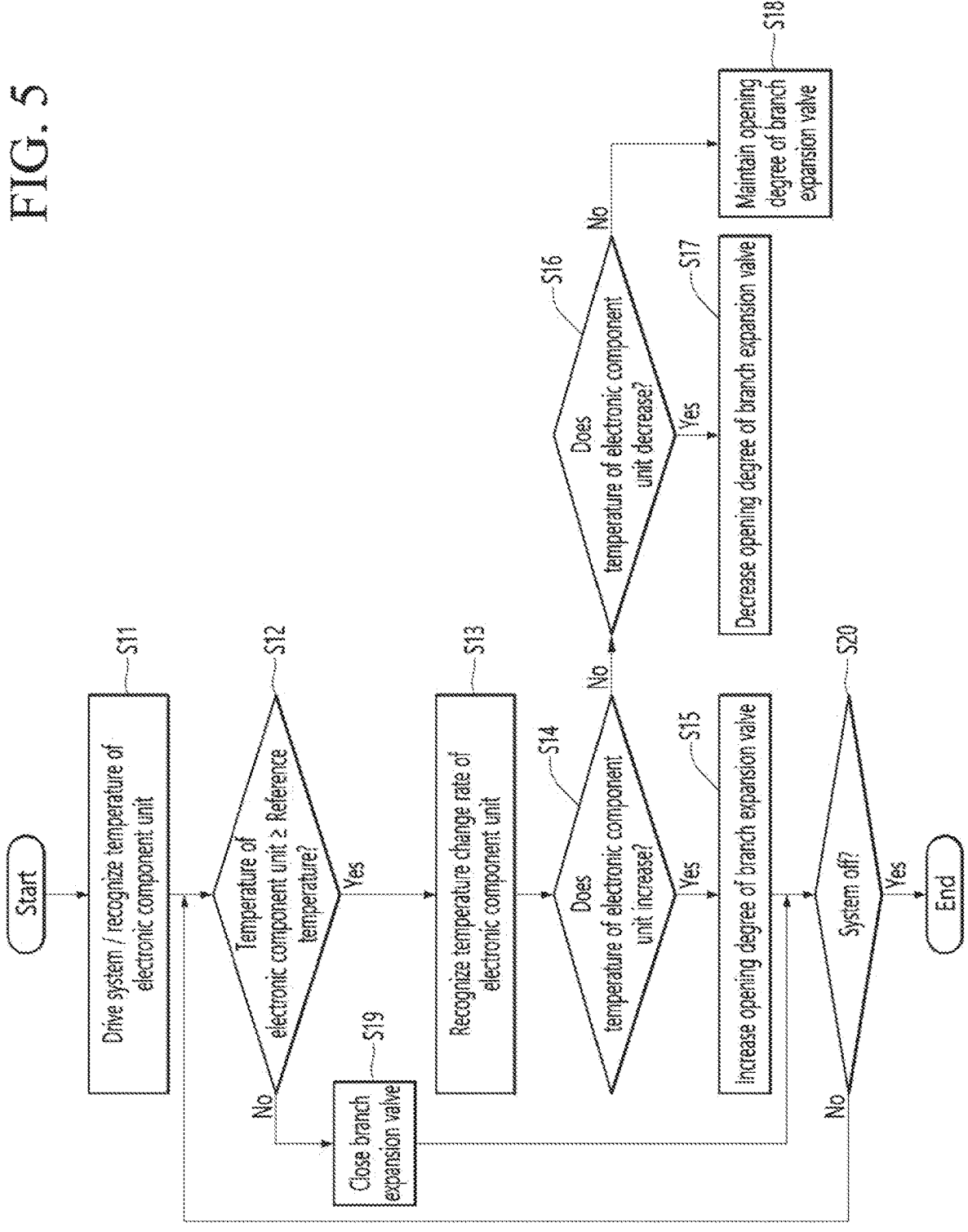
FIG. 5 is a flowchart showing a method for controlling a water heater according to a first embodiment of the present disclosure.

FIG. 4 is a cycle diagram showing a configuration of a water heater according to a first embodiment of the present disclosure, and FIG. 5 is a flowchart showing a method for controlling a water heater according to a first embodiment of the present disclosure.

First, referring to FIG. 4, the water heater 100 according to the first embodiment of the present disclosure may include a plurality of components constituting a refrigeration cycle and a refrigerant pipe that connects the plurality of components and guides the flow of refrigerant.

The water heater 100 may include a compressor 110 that compresses the refrigerant. A discharge pipe 112 that guides the refrigerant compressed in the compressor 110 to the condenser 120 may be connected to the discharge side of the compressor 110.

A gas-liquid separator 180 may be connected to the suction side of the compressor 110. The gas-liquid separator 180 may be configured to filter liquid refrigerant from the refrigerant sucked into the compressor 110 and transfer separated gaseous refrigerant to the compressor 110.

The discharge side of the compressor 110 may include an oil separator 115 that separates oil from the refrigerant discharged from the compressor 110. The oil separator 115 may be installed in the discharge pipe 112.

The refrigerant that has passed through the oil separator 115 may be discharged to the discharge pipe 112 through a first discharge portion of the oil separator 115 and may be introduced into the condenser 120 through the discharge pipe 112.

The oil separated in the oil separator 115 may be returned to the compressor 110 through a return pipe 116. The return pipe 116 may extend from the second discharge portion of the oil separator 115 and may be returned to the compressor 110 through a return port of the compressor 110.

A check valve 117 that guides the one-way flow of oil from the oil separator 115 to the compressor 110 may be installed in the return pipe 116. The check valve 117 may restrict the flow of oil from the compressor 110 toward the oil separator 115.

A discharge temperature sensor 113 that detects the temperature of the refrigerant discharged from the compressor 110 may be installed in the discharge pipe 112.

A high pressure sensor 114 that detects the pressure of the refrigerant discharged from the compressor 110 may be installed in the discharge pipe 112.

The discharge pipe 112 is connected to the condenser 120.

The condenser 120 may be configured as a water refrigerant heat exchanger that performs heat exchange between the refrigerant and the water.

The condenser 120 may include a refrigerant passage 125 and a water passage 121. Heat exchange may occur between the refrigerant flowing through the refrigerant passage 125 and the water flowing through the water passage 121. For example, the refrigerant passage 125 and the water passage 121 may be in contact with each other or may be disposed adjacent to each other.

Due to the heat exchange between the refrigerant passage 125 and the water passage 121, the refrigerant temperature in the refrigerant passage 125 may decrease and the water temperature in the water passage 121 may increase.

The refrigerant passage 125 may be connected to the discharge pipe 112, such that the refrigerant flowing through the discharge pipe 112 is introduced into the refrigerant passage 125.

The water transferred from the hot water use place 30 may flow through the water passage 121. The water transferred from the hot water use place 30 may flow through the water inlet port 108a of the water heater 100 and the condenser inlet passage 109a.

The condenser inlet passage 109a may be understood as a water pipe extending from the water inlet port 108a to the water passage 121 of the condenser 120 and connecting the water inlet port 108a to the water passage 121. The water introduced into the water passage 121 through the condenser inlet passage 109a may exchange heat with the refrigerant in the refrigerant passage 125.

A condenser outlet passage 109b may be connected to the water passage 121. The condenser outlet passage 109b may extend from the water passage 121 to the water outlet port

108b. The water, the heat of which is exchanged with the refrigerant of the water heater 100 in the condenser 120, may be discharged from the water outlet port 108b through the condenser outlet passage 109b.

High-temperature water discharged from the water outlet port 108b may be supplied to the hot water use place 30.

A first temperature sensor 122a may be installed in the condenser inlet passage 109a. The first temperature sensor 122a may detect the temperature of water introduced into the water heater 100 through the water inlet port 108a.

A second temperature sensor 122b may be installed in the condenser outlet passage 109b. The second temperature sensor 122b may detect the temperature of water heat-exchanged in the condenser 120.

The water heater 100 may further include a condenser outlet pipe 130 connected to the outlet side of the condenser 120. The condenser outlet pipe 130 may be connected to the refrigerant passage 125 of the condenser 120 and may guide the flow of refrigerant discharged from the refrigerant passage 125.

The condenser outlet pipe 130 may be understood as a refrigerant pipe extending from the condenser 120 to the evaporator 150.

The condenser outlet pipe 130 may include a branch portion 131 to which a branch pipe 132 is connected. The branch pipe 132 may be branched and extended from the branch portion 131.

A branch expansion valve 133 may be installed in the branch pipe 132. The branch expansion valve 133 may depressurize (expand) the refrigerant flowing through the branch pipe 132.

The branch expansion valve 133 may include, for example, an electric expansion valve (EEV) whose opening degree is adjustable. The amount of refrigerant flowing through the branch pipe 132 may be adjusted according to the opening degree of the branch expansion valve 133.

The cooling unit 135 may be connected to the branch pipe 132. The cooling unit 135 may be coupled to the electronic component unit 140 to cool the electronic component unit 140. It may be understood that the cooling unit 135 forms a portion of the branch pipe 132.

As the refrigerant is depressurized in the branch expansion valve 133, the temperature decreases and the low-temperature refrigerant may cool the electronic component unit 140.

For example, the temperature of the refrigerant depressurized in the branch expansion valve 133 may be approximately 40° C., and the refrigerant may cool the electronic component unit 140 to approximately 80° C. or higher.

The water heater 100 may further include an electronic component temperature sensor 136 that detects the temperature of the electronic component unit 140. For example, the electronic component temperature sensor 136 may be installed in the heat sink 135a or the electronic component case.

The condenser outlet pipe 130 may further include a joining portion 137 to which the branch pipe 132 is joined. The refrigerant that has cooled the electronic component unit 140 in the cooling unit 135 may be joined with the refrigerant in the condenser outlet pipe 130 through joining portion 137.

That is, one end portion of the branch pipe 132 may be connected to the branch portion 131, and the other end portion of the branch pipe 132 may be connected to the joining portion 137.

A strainer 142 may be installed in the condenser outlet pipe 130 to filter foreign substances in the refrigerant. The strainer 142 may be installed at a point of the condenser outlet pipe 130 located between the branch portion 131 and the joining portion 137.

A main expansion valve 145 may be installed in the condenser outlet pipe 130 to depressurize the high-temperature condensed refrigerant. The main expansion valve 145 may include, for example, an EEV whose opening degree is adjustable. The amount of refrigerant flowing through the condenser outlet pipe 130 may be adjusted according to the opening degree of the main expansion valve 145.

The main expansion valve 145 may be installed at another point of the condenser outlet pipe 130 located between the branch portion 131 and the joining portion 137.

The refrigerant that is depressurized in the branch expansion valve 133 and cools the electronic component unit 140 and the refrigerant that is depressurized in the main expansion valve 145 may be joined in the joining portion 137.

An evaporator 150 may be connected to the condenser outlet pipe 130.

The evaporator 150 may be configured as a cascade heat exchanger in which heat is exchanged between the refrigerants.

The evaporator 150 may include a first refrigerant passage 151 and a second refrigerant passage 155. Heat exchange may occur between the refrigerant flowing through the first refrigerant passage 151 and the refrigerant flowing through the second refrigerant passage 155. For example, the first refrigerant passage 151 and the second refrigerant passage 155 may be in contact with or adjacent to each other.

Due to the heat exchange between the first refrigerant passage 151 and the second refrigerant passage 155, the refrigerant temperature in the first refrigerant passage 151 may increase, and the refrigerant temperature in the second refrigerant passage 155 may decrease.

The first refrigerant passage 151 may be connected to the condenser outlet pipe 130, such that the refrigerant flowing through the condenser outlet pipe 130 is introduced into the first refrigerant passage 151.

The refrigerant transferred from the outdoor unit 20 may flow through the second refrigerant passage 155. The refrigerant transferred from the outdoor unit 20 may flow through the evaporator inlet passage 161a via the refrigerant inlet port 107a of the water heater 100.

The condenser inlet passage 161a may be understood as a refrigerant pipe extending from the refrigerant inlet port 107a to the second refrigerant passage 155 of the evaporator 150 and connecting the refrigerant inlet port 107a to the second refrigerant passage 155. The refrigerant introduced into the second refrigerant passage 155 through the evaporator inlet passage 161a may exchange heat with the refrigerant in the first refrigerant passage 151.

An evaporator outlet passage 161b may be connected to the second refrigerant passage 155. The evaporator outlet passage 161b may extend from the second refrigerant passage 155 to the refrigerant outlet port 107b. The refrigerant, which has exchanged heat with the refrigerant of the water heater 100 in the evaporator 150, may be discharged from the refrigerant outlet port 107b through the evaporator outlet passage 161b.

The refrigerant discharged from the refrigerant outlet port 107b may be returned to the outdoor unit 20.

A third temperature sensor 162 may be installed in the evaporator inlet passage 161a. The third temperature sensor 162 may detect the temperature of the refrigerant introduced into the water heater 100 through the refrigerant inlet port 107a.

A fourth temperature sensor 164 may be installed in the evaporator outlet passage 161b. The fourth temperature sensor 164 may detect the temperature of the refrigerant heat-exchanged in the evaporator 150.

An evaporator-side expansion valve 160 that depressurizes the refrigerant may be installed in the evaporator outlet passage 161b. High-temperature refrigerant compressed from the outdoor unit 20 is introduced into the evaporator inlet passage 161a, and the compressed refrigerant may be condensed in the evaporator 150. The condensed refrigerant may flow into the low pressure-side pipe of the outdoor unit 20 after being depressurized in the evaporator-side expansion valve 160.

The water heater 100 may further include a low pressure pipe 170 connected to the outlet side of the evaporator 150. The low pressure pipe 170 may be understood as a refrigerant pipe extending from the evaporator 150 to the compressor 110.

The gas-liquid separator 180 may be installed in the low pressure pipe 170, and the compressor 110 may be connected to the outlet side of the gas-liquid separator 180.

A suction temperature sensor 172 may be installed in the low pressure pipe 170 to detect the temperature of the refrigerant flowing through the low pressure pipe 170. The temperature of the refrigerant sucked into the compressor 110 may be detected through the suction temperature sensor 172.

A low pressure sensor 174 may be installed in the low pressure pipe 170 to detect the pressure of the refrigerant flowing through the low pressure pipe 170.

The suction temperature sensor 172 and the low pressure sensor 174 may be installed in a portion of the low pressure pipe 170 connecting the evaporator 150 to the gas-liquid separator 180.

The refrigerant that has passed through the evaporator 150 is introduced into the gas-liquid separator 180 through the low pressure pipe 170. The refrigerant separated in the gas-liquid separator 180 may be sucked into the compressor 110.

A method for controlling the water heater 100 according to the first embodiment of the present disclosure will be described with reference to FIG. 5.

The hot water system 10 may operate and wait for a set time. When the system is stabilized, the temperature of the electronic component unit 140 may be recognized. The electronic component unit 140 may be detected through the electronic component temperature sensor 136 (S11).

When the temperature of the electronic component unit 140 is higher than or equal to a reference temperature, the controller of the water heater 100 may recognize a temperature change rate of the electronic component unit 140 (S12, S13).

While the water heater 100 operates, the cooling unit 135 may cool the electronic component unit 140. Despite the cooling operation, when the temperature of the electronic component unit 140 increases, the cooling capacity of the cooling unit 135 may be recognized as low.

Accordingly, when the controller recognizes that the temperature of the electronic component unit 140 has increased, the controller may increase the opening degree of the branch expansion valve 133.

As the opening degree of the branch expansion valve 133 increases, the amount of refrigerant flowing through the branch pipe 132 may increase and a relatively large amount of refrigerant may also flow into the cooling unit 135. Consequently, the cooling capacity of the electronic component unit 140 may increase (S14, S15).

On the other hand, when the controller recognizes that the temperature of the electronic component unit 140 has decreased, the controller may reduce the opening degree of the branch expansion valve 133.

As the opening degree of the branch expansion valve 133 decreases, the amount of refrigerant flowing through the branch pipe 132 may decrease and a relatively small amount of refrigerant may also flow into the cooling unit 135. Consequently, the cooling capacity of the electronic component unit 140 may decrease.

When there is too much refrigerant flowing through the branch pipe 132, the amount of refrigerant flowing through the condenser outlet pipe 130 may decrease, thereby reducing the operating capability of the system. Therefore, the branch expansion valve 133 may be controlled as described above, such that a small amount of refrigerant flows through the branch pipe 132 within a range where the temperature of the electronic component unit 140 does not rise too much (S16, S17).

When the temperature of the electronic component unit 140 does not substantially change, the controller may maintain the opening degree of the branch expansion valve 133 (S18).

On the other hand, when the temperature of the electronic component unit 140 is below the reference temperature in operation S12, the branch expansion valve 133 may be closed. In this case, the refrigerant flow through the branch pipe 132 may be restricted (S19).

In this manner, the control of adjusting the opening degree of the branch expansion valve 133 according to the temperature of the electronic component unit 140 may be performed until the hot water system 10 is turned off (S20).

Hereinafter, the second and third embodiments of the present disclosure will be described. In the case of these embodiments, since there is a difference from the first embodiment in the configuration of the passages and components for cooling the electronic component unit, the differences will be mainly explained. Accordingly, the description and reference numerals of the first embodiment are used for the same parts as those of the first embodiment.

Figure 6:
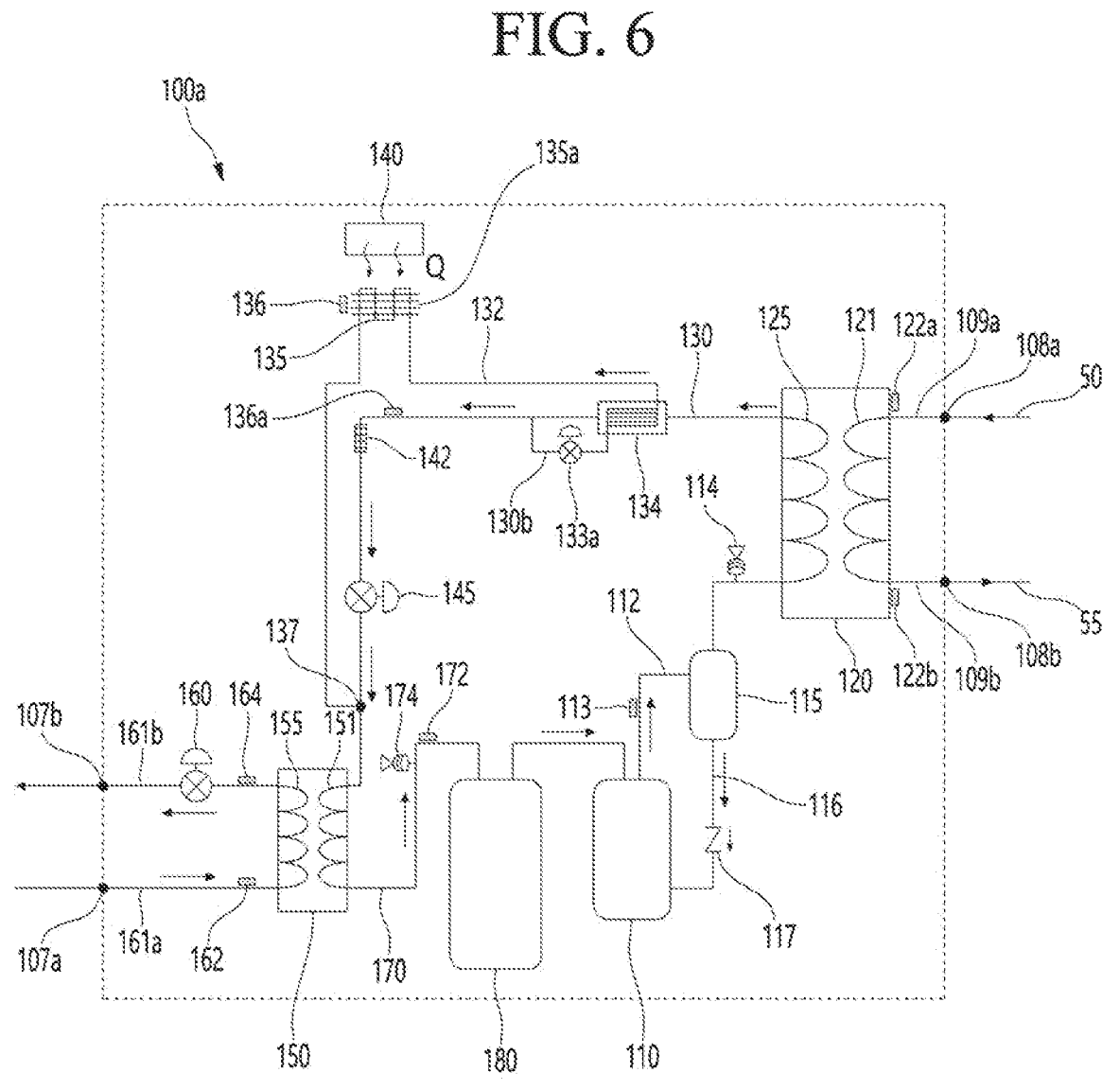
Figure 7:
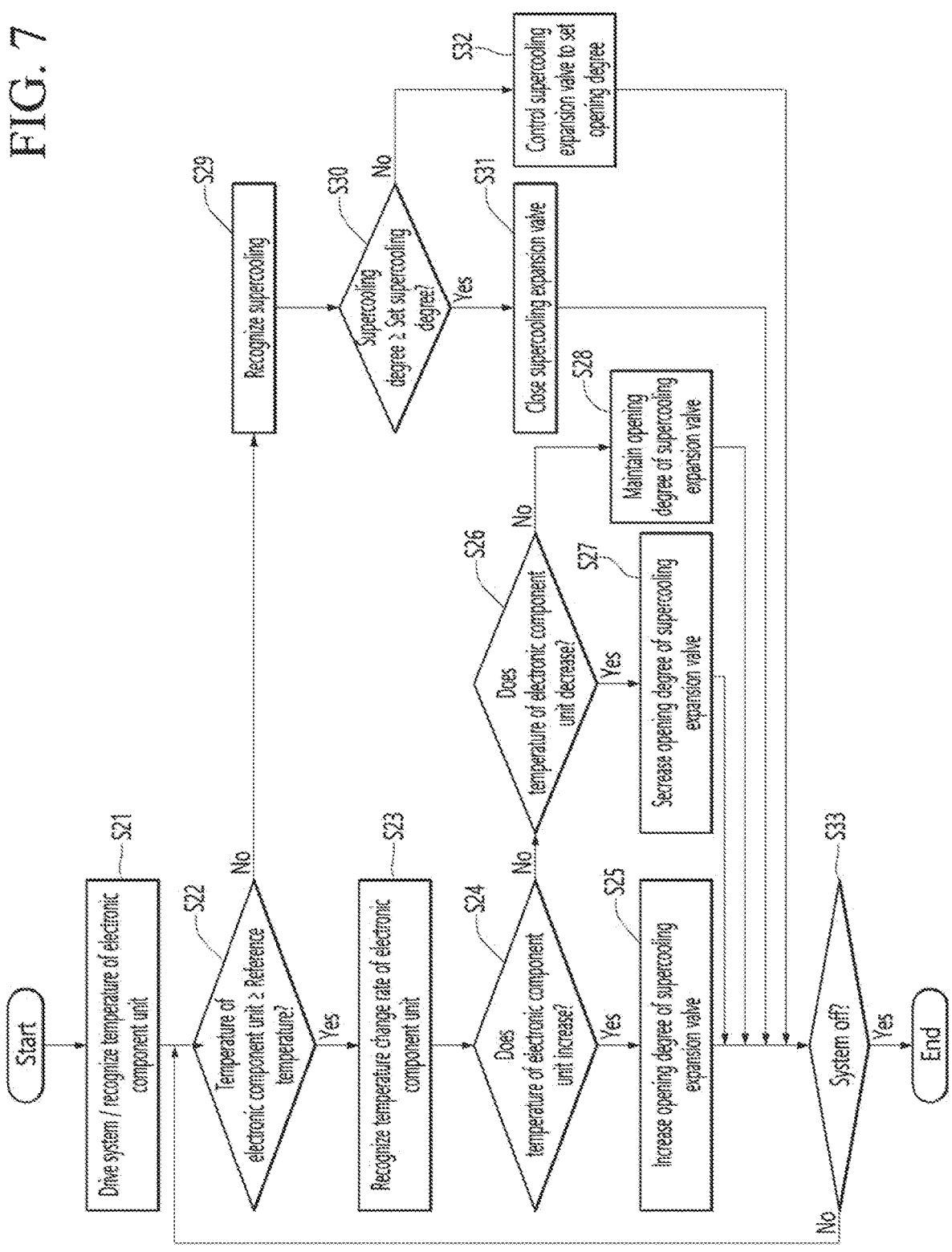
FIG. 7 is a flowchart showing a method for controlling a water heater according to a second embodiment of the present disclosure.

FIG. 6 is a cycle diagram showing a configuration of a water heater according to a second embodiment of the present disclosure, and FIG. 7 is a flowchart showing a method for controlling a water heater according to a second embodiment of the present disclosure.

First, referring to FIG. 6, a water heater 100a according to a second embodiment of the present disclosure may include a plurality of components constituting a refrigeration cycle and a refrigerant pipe that connects the plurality of components and guides the flow of refrigerant.

The water heater 100a may include a compressor 110 that compresses the refrigerant, a discharge pipe 112, a gas-liquid separator 180, an oil separator 115, a discharge temperature sensor 113, and a high pressure sensor 114. The description of the first embodiment may be equally applied to the elements described above.

The water heater 100a may further include a condenser 120. The condenser 120 may include a refrigerant passage 125 and a water passage 121. The description of the first embodiment may be equally applied to the configuration of the condenser 120, a condenser inlet passage 109a, and a condenser outlet passage 109b.

The water heater 100a may further include a condenser outlet pipe 130 connected to the outlet side of the condenser 120. The condenser outlet pipe 130 may be connected to the refrigerant passage 125 of the condenser 120 and may guide the flow of refrigerant discharged from the refrigerant passage 125.

The condenser outlet pipe 130 may be understood as a refrigerant pipe extending from the condenser 120 to the evaporator 150.

A supercooler 134 may be installed in the condenser outlet pipe 130.

The supercooler 134 may function as an intermediate heat exchanger in which a first refrigerant circulating through the water heater 100a and a portion of the first refrigerant (a second refrigerant) are branched and then exchange heat with each other.

The first refrigerant may be referred to as a main refrigerant, and the second refrigerant may be referred to as a branch refrigerant.

The first refrigerant may be introduced into the supercooler 134 and supercooled by the second refrigerant. On the other hand, the second refrigerant may absorb heat from the first refrigerant.

The water heater 100a may include a supercooling passage 130b provided on the inlet or outlet side of the supercooler 134 and branched from the condenser outlet pipe 130. In FIG. 6, for example, the supercooling passage 130b is shown as branching from the condenser outlet pipe 130 at the outlet side of the supercooler 134.

The first refrigerant may flow in the condenser outlet pipe 130, and the second refrigerant may flow in the supercooling passage 130b.

A supercooling expansion valve 133a for depressurizing the second refrigerant is provided in the supercooling passage 130b. The supercooling expansion valve 133a may include an EEV whose opening degree is adjustable.

The supercooling passage 130b may exchange heat with the refrigerant of the condenser outlet pipe 130 in the supercooler 134.

In detail, the temperature of the second refrigerant in the supercooling passage 130b may decrease as the second refrigerant is depressurized in the supercooling expansion valve 133a. The refrigerant whose temperature has decreased may be introduced into the supercooler 134 and exchange heat with the first refrigerant of the condenser outlet pipe 130. In this process, the first refrigerant may be supercooled.

A cooling unit 135 may be connected to the supercooling passage 130b. The cooling unit 135 may form a portion of the supercooling passage 130b.

The refrigerant in the cooling unit 135 may cool the electronic component unit 140.

The water heater 100a may further include an electronic component temperature sensor 136 that detects the temperature of the electronic component unit 140.

A supercooling temperature sensor 136a disposed on the outlet side of the supercooler 134 may be installed in the condenser outlet pipe 130. The supercooling temperature sensor 136a may detect the temperature of the first refrigerant that is supercooled while passing through the supercooler 134.

A difference value between the temperature of the first refrigerant detected by the supercooling temperature sensor 136a and the temperature of the ideal refrigerant (dryness: 0 state) of the pressure (high pressure) detected by the high pressure sensor 114 may be calculated as the supercooling degree.

The condenser outlet pipe 130 may further include a joining portion 137 to which the supercooling passage 130b is joined. The refrigerant that has cooled the electronic component unit 140 in the cooling unit 135 may be joined with the refrigerant in the condenser outlet pipe 130 through the joining portion 137.

In this manner, due to the configuration of the supercooler 134, the supercooling passage 130*b*, and the cooling unit 135 in the condenser outlet pipe 130, the supercooling of the condensed main refrigerant and the cooling of electronic component unit may be performed simultaneously. Accordingly, there is an advantage of improving the operation efficiency of the water heater and efficiently cooling the electronic component unit.

A strainer 142 may be installed in the condenser outlet pipe 130 to filter foreign substances in the refrigerant. The strainer 142 may be installed at a point of the condenser outlet pipe 130 located between the supercooler 134 and the joining portion 137.

A main expansion valve 145 may be installed in the condenser outlet pipe 130. The main expansion valve 145 may include, for example, an EEV whose opening degree is adjustable. The amount of refrigerant flowing through the condenser outlet pipe 130 may be adjusted according to the opening degree of the main expansion valve 145.

The main expansion valve 145 may be installed at another point of the condenser outlet pipe 130 located between the supercooler 134 and the joining portion 137.

The refrigerant depressurized in the supercooling expansion valve 133*a* and cooled the electronic component unit 140 and the refrigerant depressurized in the main expansion valve 145 may be joined in the joining portion 137.

An evaporator 150 may be connected to the condenser outlet pipe 130.

The evaporator 150 may include a first refrigerant passage 151 and a second refrigerant passage 155. The description of the first embodiment may be equally applied to an evaporator 150, an evaporator inlet passage 161*a*, an evaporator outlet passage 161*b*, a third temperature sensor 162, a fourth temperature sensor 164, and an evaporator-side expansion valve 160.

The water heater 100*a* may further include a low pressure pipe 170 connected to the outlet side of the evaporator 150. The low pressure pipe 170 may be understood as a refrigerant pipe extending from the evaporator 150 to the compressor 110.

The gas-liquid separator 180 may be installed in the low pressure pipe 170, and the compressor 110 may be connected to the outlet side of the gas-liquid separator 180. The description of the first embodiment may be equally applied to the low pressure pipe 170, the suction temperature sensor 172, and the low pressure sensor 174.

A method for controlling the water heater 100*a* according to the second embodiment of the present disclosure will be described with reference to FIG. 7.

The hot water system 10 may operate and wait for a set time. When the system is stabilized, the temperature of the electronic component unit 140 may be recognized. The electronic component unit 140 may be detected through the electronic component temperature sensor 136 (S21).

When the temperature of the electronic component unit 140 is higher than or equal to a reference temperature, the controller of the water heater 100*a* may recognize a temperature change rate of the electronic component unit 140 (S22, S23).

While the water heater 100*a* operates, the cooling unit 135 may cool the electronic component unit 140. Despite the cooling operation, when the temperature of the electronic component unit 140 increases, the cooling capacity of the cooling unit 135 may be recognized as low.

Accordingly, when the controller recognizes that the temperature of the electronic component unit 140 has increased, the controller may increase the opening degree of the supercooling expansion valve 133*a*.

As the opening degree of the supercooling expansion valve 133*a* increases, the amount of refrigerant flowing through the supercooling passage 130*b* may increase and a relatively large amount of refrigerant may also flow into the cooling unit 135. Consequently, the cooling capacity of the electronic component unit 140 may increase (S24, S25).

On the other hand, when the controller recognizes that the temperature of the electronic component unit 140 has decreased, the controller may reduce the opening degree of the supercooling expansion valve 133*a*.

As the opening degree of the supercooling expansion valve 133*a* decreases, the amount of refrigerant flowing through the supercooling passage 130*b* may decrease and a relatively small amount of refrigerant may also flow into the cooling unit 135. Consequently, the cooling capacity of the electronic component unit 140 may decrease.

When there is too much refrigerant flowing through the supercooling passage 130*b*, the amount of refrigerant flowing through the condenser outlet pipe 130 may decrease, thereby reducing the operating capability of the system. Therefore, the supercooling expansion valve 133*a* may be controlled as described above, such that a small amount of refrigerant flows through the supercooling passage 130*b* within a range where the temperature of the electronic component unit 140 does not rise too much (S26, S27).

On the other hand, when the temperature of the electronic component unit 140 does not substantially change, the controller may maintain the opening degree of the supercooling expansion valve 133*a* (S28).

On the other hand, when the temperature of the electronic component unit 140 is lower than or equal to the reference temperature in operation S22, the controller may calculate the supercooling degree from a difference between a first temperature value detected by the supercooling temperature sensor 136*a* and a second temperature value calculated from the high pressure detected by the high pressure sensor 114 (S29).

When the supercooling degree is greater than or equal to a set supercooling degree, it is recognized that sufficient supercooling degree has been formed for efficient operation of the water heater 100*a* and the supercooling expansion valve 133*a* may be closed (S30, S31).

On the other hand, when the supercooling degree is less than or equal to a set supercooling degree, it is recognized that supercooling degree is not formed for efficient operation of the water heater 100*a* and the supercooling expansion valve 133*a* may be controlled to be opened to the set opening degree.

For example, the set opening degree may be a minimum opening degree of the supercooling expansion valve 133*a*.

As such, when the temperature of the electronic component unit 140 is lower than or equal to the reference temperature, the operation of the cooling unit 135 for cooling the electronic component unit 140 may not be required. However, in order to secure the operating efficiency (supercooling degree) of the water heater 100*a*, the supercooling expansion valve 133*a* may be opened to the set opening degree so as to allow the supercooler 134 to perform heat exchange (S32).

In this manner, the control of adjusting the opening degree of the supercooling expansion valve 133*a* according to the temperature of the electronic component unit 140 may be performed until the hot water system 10 is turned off (S33).

Figure 8:
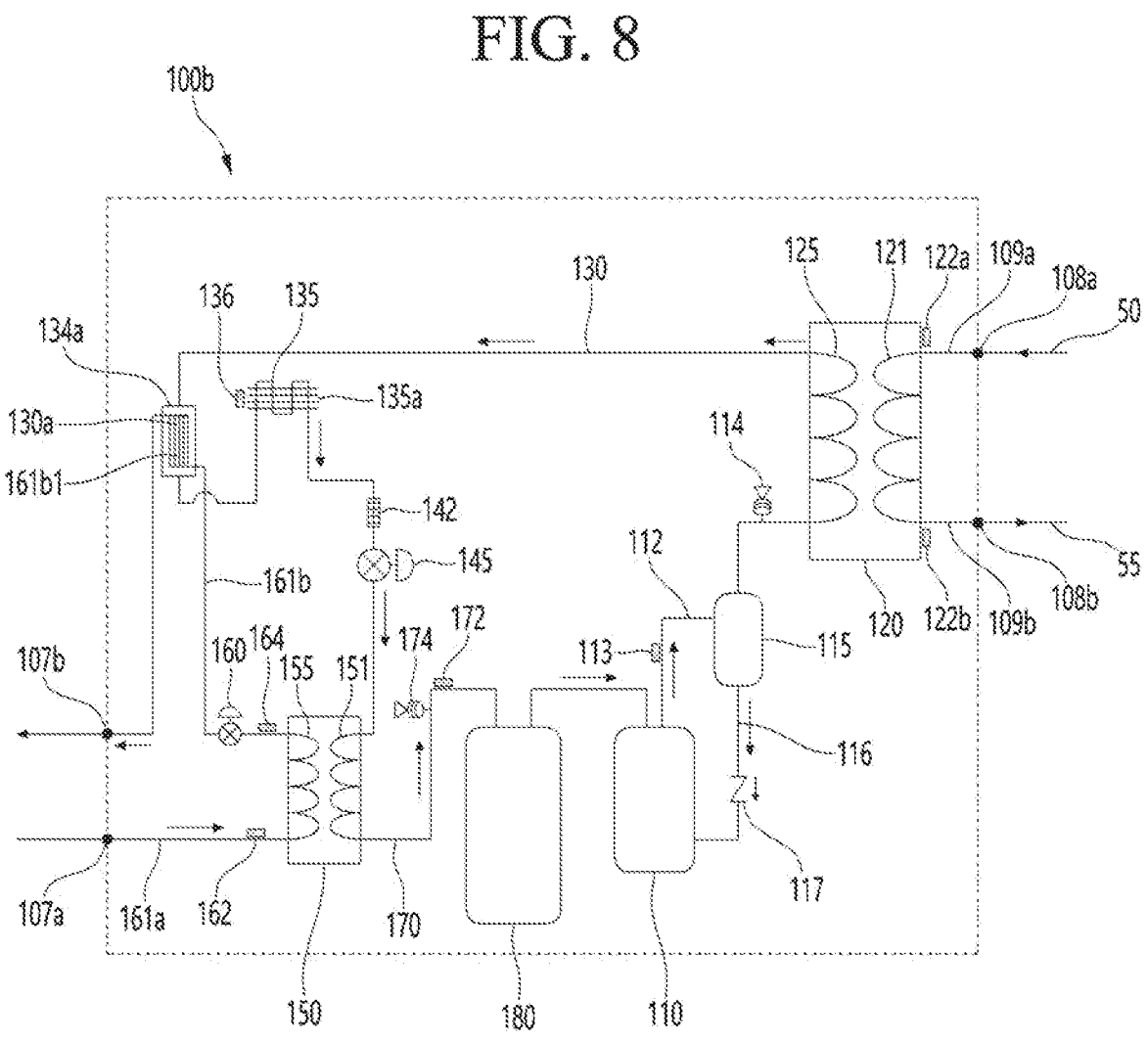
FIG. 8 is a cycle diagram showing a configuration of a water heater according to a third embodiment of the present disclosure.
Figure 9:
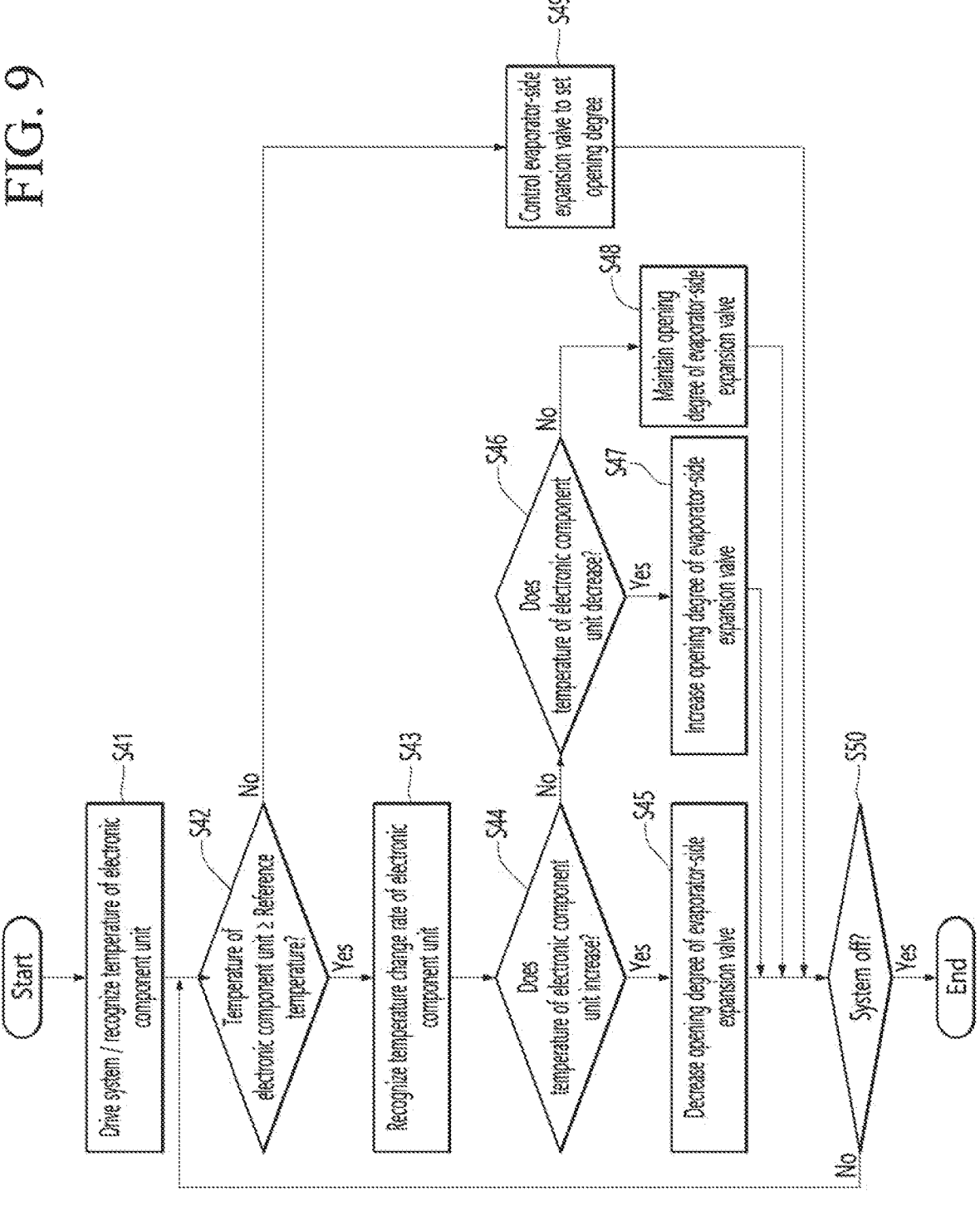
FIG. 9 is a flowchart showing a method for controlling a water heater according to a third embodiment of the present disclosure.

FIG. 8 is a cycle diagram showing a configuration of a water heater according to a third embodiment of the present disclosure, and FIG. 9 is a flowchart showing a method for controlling a water heater according to a third embodiment of the present disclosure.

First, referring to FIG. 8, a water heater 100*b* according to a third embodiment of the present disclosure may include a plurality of components constituting a refrigeration cycle and a refrigerant pipe that connects the plurality of components and guides the flow of refrigerant.

The water heater 100*b* may include a compressor 110 that compresses the refrigerant, a discharge pipe 112, a gas-liquid separator 180, an oil separator 115, a discharge temperature sensor 113, and a high pressure sensor 114. The description of the first embodiment may be equally applied to the elements described above.

The water heater 100*b* may further include a condenser 120. The condenser 120 may include a refrigerant passage 125 and a water passage 121. The description of the first embodiment may be equally applied to the configuration of the condenser 120, a condenser inlet passage 109*a*, and a condenser outlet passage 109*b*.

The water heater 100*b* may further include a condenser outlet pipe 130 connected to the outlet side of the condenser 120. The condenser outlet pipe 130 may be connected to the refrigerant passage 125 of the condenser 120 and may guide the flow of refrigerant discharged from the refrigerant passage 125.

The condenser outlet pipe 130 may be understood as a refrigerant pipe extending from the condenser 120 to the evaporator 150.

An evaporator 150 may be connected to the condenser outlet pipe 130.

The evaporator 150 may include a first refrigerant passage 151 and a second refrigerant passage 155. The description of the first embodiment may be equally applied to an evaporator 150, an evaporator inlet passage 161*a*, an evaporator outlet passage 161*b*, a third temperature sensor 162, a fourth temperature sensor 164, and an evaporator-side expansion valve 160.

The difference between the present embodiment and the previous embodiments is related to the structure in which an additional heat exchanger 134*a* is installed in an evaporator outlet passage 161*b*.

In detail, the additional heat exchanger 134*a* may be installed in the condenser outlet pipe 130. The additional heat exchanger 134*a* may be understood as a heat exchanger that performs heat exchange between the refrigerant (first refrigerant) circulating through the water heater 100*b* and the refrigerant (second refrigerant) circulating through the outdoor unit 20.

The additional heat exchanger 134*a* may include a first heat exchange portion 130*a* through which the first refrigerant flows and a second heat exchange portion 161*b*1 through which the second refrigerant flows. The first heat exchange portion 130*a* and the second heat exchange portion 161*b*1 may be in contact with each other or may be arranged adjacent to each other within the additional heat exchanger 134*a*.

The first heat exchange portion 130*a* may be connected to the condenser outlet pipe 130. The first heat exchange portion 130*a* may be understood as a portion of the condenser outlet pipe 130.

The second heat exchange portion 161*b*1 may be connected to the evaporator outlet passage 161*b* through which the refrigerant passing through the evaporator 150 flows.

The second heat exchange portion 161*b*1 may be understood as a portion of the evaporator outlet passage 161*b*.

The evaporator outlet passage 161*b* may not extend directly to the refrigerant outlet port 107*b*, but may be connected to the second heat exchange portion 161*b*1 of the additional heat exchanger 134*a*. The refrigerant that has passed through the additional heat exchanger 134*a* in the evaporator outlet passage 161*b* may exchange heat with the first heat exchange portion 130*a* and then may be discharged through the refrigerant outlet port 107*b*.

An evaporator-side expansion valve 160 may be installed in the evaporator outlet passage 161*b*1. The evaporator-side expansion valve 160 may be disposed on the inlet side of the additional heat exchanger 134*a*, and the refrigerant depressurized in the evaporator-side expansion valve 160 may be introduced into the additional heat exchanger 134*a* to cool the refrigerant in the first heat exchange portion 130*a*.

The first heat exchange portion 130*a* may be cooled through heat exchange with the second heat exchange portion 161*b*1 and then discharged from the additional heat exchanger 134*a*.

A cooling unit 135 may be connected to the outlet side of the additional heat exchanger 134*a*. The refrigerant cooled in the additional heat exchanger 134*a* may cool the electronic component unit 140 while flowing through the cooling unit 135.

The water heater 100*b* may further include an electronic component temperature sensor 136 that detects the temperature of the electronic component unit 140.

A strainer 142 and a main expansion valve 145 may be installed in the condenser outlet pipe 130. The strainer 142 and the main expansion valve 145 may be installed on the outlet side of the cooling unit 135.

The description of the first embodiment may be equally applied to the functions of the strainer 142 and the main expansion valve 145.

An evaporator 150 may be connected to the condenser outlet pipe 130. The evaporator 150 may be connected to the outlet side of the main expansion valve 145.

The evaporator 150 may include a first refrigerant passage 151 and a second refrigerant passage 155.

The water heater 100*b* may further include a low pressure pipe 170 connected to the outlet side of the evaporator 150. The low pressure pipe 170 may be understood as a refrigerant pipe extending from the evaporator 150 to the compressor 110.

The gas-liquid separator 180 may be installed in the low pressure pipe 170, and the compressor 110 may be connected to the outlet side of the gas-liquid separator 180. The description of the first embodiment may be equally applied to the low pressure pipe 170, the suction temperature sensor 172, and the low pressure sensor 174.

A method for controlling the water heater 100*b* according to the third embodiment of the present disclosure will be described with reference to FIG. 9.

The hot water system 10 may operate and wait for a set time. When the system is stabilized, the temperature of the electronic component unit 140 may be recognized. The electronic component unit 140 may be detected through the electronic component temperature sensor 136 (S41).

When the temperature of the electronic component unit 140 is higher than or equal to a reference temperature, the controller of the water heater 100*b* may recognize a temperature change rate of the electronic component unit 140 (S42, S43).

While the water heater 100*b* operates, the cooling unit 135 may cool the electronic component unit 140. Despite the cooling operation, when the temperature of the electronic component unit 140 increases, the cooling capacity of the cooling unit 135 may be recognized as low.

Accordingly, when the controller recognizes that the temperature of the electronic component unit 140 has increased, the controller may decrease the opening degree of the evaporator-side expansion valve 160.

As the opening degree of the evaporator-side expansion valve 160 decreases, the depressurization degree of the refrigerant flowing through the evaporator outlet passage 161*b* increases and the temperature of the refrigerant further decreases. Accordingly, the temperature of the refrigerant in the first heat exchange portion 130*a* cooled in the additional heat exchanger 134*a* may be further lowered (S44, S45).

On the other hand, when the controller recognizes that the temperature of the electronic component unit 140 has decreased, the controller may increase the opening degree of the evaporator-side expansion valve 160.

As the opening degree of the evaporator-side expansion valve 160 increases, the depressurization degree of the refrigerant flowing through the evaporator outlet passage 161*b* decreases and the temperature of the refrigerant relatively increases. Accordingly, the temperature of the refrigerant in the first heat exchange portion 130*a* cooled in the additional heat exchanger 134*a* may relatively increase (S46, S47).

On the other hand, when the temperature of the electronic component unit 140 does not substantially change, the controller may maintain the opening degree of the evaporator-side expansion valve 160 (S48).

On the other hand, when the temperature of the electronic component unit 140 is lower than or equal to the reference temperature in operation S42, the opening degree of the evaporator-side expansion valve 160 may be opened to the set opening degree. For example, the set opening degree may be a maximum opening degree.

As such, when the cooling of the electronic component unit 140 is not required, the amount of heat exchange between the first and second refrigerant passages 151 and 155 in the evaporator 150 may be increased by increasing the opening degree of the evaporator-side expansion valve 160 as much as possible. Accordingly, the heat exchange efficiency in the evaporator 150 may be improved (S49).

In this manner, the control of adjusting the opening degree of the evaporator-side expansion valve 160 according to the temperature of the electronic component unit 140 may be performed until the hot water system 10 is turned off (S50).

According to an embodiment of the present disclosure, an electronic component unit may be efficiently cooled by using a refrigerant cooling method.

According to an embodiment of the present disclosure, a temperature of a refrigerant may be lowered by depressurizing a refrigerant that has passed through a high-temperature water refrigerant heat exchanger, and then, an electronic component unit may be cooled, thereby improving the cooling efficiency of the electronic component unit.

According to an embodiment of the present disclosure, the temperature of the refrigerant used to cool the electronic component unit may be adjusted based on the temperature of the electronic component unit.

According to an embodiment of the present disclosure, a supercooler may be installed on an outlet side of a condenser and an electronic component unit may be efficiently cooled by using a refrigerant cooled while passing through the supercooler.

According to an embodiment of the present disclosure, an electronic component unit may be efficiently cooled by using a heat source of a refrigerant circulating through an outdoor unit.

According to an embodiment of the present disclosure, an additional heat exchanger may be installed on an outlet side of a condenser and may exchange heat between a refrigerant of an outdoor unit and a condensed refrigerant of the water heater, thereby efficiently cooling an electronic component unit.

What is claimed is:

1. A water heater connected to an outdoor unit through first and second refrigerant lines, the outdoor unit including an outdoor heat exchanger that exchanges heat with air, the water heater being connected to a hot water use place to supply hot water through first and second water lines, the water heater comprising:
    an electronic component unit provided with control components;
    a compressor configured to compress a refrigerant;
    a condenser provided on an outlet side of the compressor and configured to perform heat exchange between a refrigerant passage through which the refrigerant compressed in the compressor flows and a water passage through which water transferred from the hot water use place flows;
    a condenser outlet pipe extending from an outlet side of the condenser;
    a cooling pipe installed in the condenser outlet pipe and configured to supply the refrigerant so as to cool the electronic component unit; and
    an evaporator disposed on an outlet side of the cooling pipe and configured to perform heat exchange between a first refrigerant passage through which the refrigerant passing through the cooling pipe flows and a second refrigerant passage through which the refrigerant transferred from the outdoor unit flows.

2. The water heater of claim 1, further comprising an additional heat exchanger installed in the condenser outlet pipe,
    wherein the additional heat exchanger comprises a first heat exchange portion connected to the condenser outlet pipe and a second heat exchange portion connected to the second refrigerant passage of the evaporator and configured to exchange heat with the first heat exchange portion.

3. The water heater of claim 2, wherein the cooling pipe is connected to an outlet side of the first heat exchange portion of the additional heat exchanger, and
    wherein a main expansion valve for depressurizing the refrigerant is installed on the outlet side of the cooling pipe.

4. The water heater of claim 2, further comprising an evaporator outlet passage extending from an outlet side of the second refrigerant passage of the evaporator to the second heat exchange portion of the additional heat exchanger,
    wherein an evaporator-side expansion valve is installed in the evaporator outlet passage so as to depressurize the refrigerant introduced into the second heat exchange portion.

5. The water heater of claim 4, further comprising a temperature sensor configured to detect a temperature of the electronic component unit, and a controller configured to adjust an opening degree of the evaporator-side expansion valve based on the temperature detected by the temperature sensor, wherein the controller is configured to decrease the opening degree of the evaporator-side expansion valve when the controller recognizes that the temperature detected by the temperature sensor changes to increase, and to increase the opening degree of the evaporator-side expansion valve when the controller recognizes that the temperature detected by the temperature sensor changes to decrease.

6. The water heater of claim 1, wherein the cooling pipe is installed on a passage through which at least a portion of the refrigerant flowing through the condenser outlet pipe branches and flows.

7. The water heater of claim 6, wherein the condenser outlet pipe comprises a branch portion, and wherein the cooling pipe is installed in a branch pipe branched from the branch portion.

8. The water heater of claim 7, wherein the condenser outlet pipe further comprises a joining portion where the branch pipe is joined, and wherein the water heater further comprises a main expansion valve installed in the condenser outlet pipe for depressurizing the refrigerant at a point between the branch portion and the joining portion.

9. The water heater of claim 7, wherein a branch expansion valve is installed in the branch pipe so as to depressurize the refrigerant flowing through the branch pipe, and the branch expansion valve comprises an electric expansion valve that allows an opening degree to be adjusted.

10. The water heater of claim 9, further comprising a temperature sensor configured to detect a temperature of the electronic component unit, and a controller configured to adjust the opening degree of the branch expansion valve based on the temperature detected by the temperature sensor, wherein the controller is configured to increase the opening degree of the branch expansion valve when the controller recognizes that the temperature detected by the temperature sensor changes to increase, and to decrease the opening degree of the branch expansion valve when the controller recognizes that the temperature detected by the temperature sensor changes to decrease.

11. The water heater of claim 6, further comprising a supercooler installed in the condenser outlet pipe and a supercooling passage branched from the condenser outlet pipe and connected to the supercooler, wherein the cooling pipe is installed on the supercooling passage at an outlet side of the supercooler.

12. The water heater of claim 11, wherein the condenser outlet pipe further comprises a joining portion where the supercooling passage is joined, and wherein a main expansion valve is installed in the condenser outlet pipe for depressurizing the refrigerant at a point between the supercooler and the joining portion.

13. The water heater of claim 11, wherein a supercooling expansion valve is installed in the supercooling passage so as to depressurize the refrigerant flowing through the supercooling passage, and the supercooling expansion valve comprises an electric expansion valve that allows an opening degree to be adjusted.

14. The water heater of claim 13, further comprising a temperature sensor configured to detect a temperature of the electronic component unit, and a controller configured to adjust the opening degree of the supercooling expansion valve based on the temperature detected by the temperature sensor, wherein the controller is configured to increase the opening degree of the supercooling expansion valve when the controller recognizes that the temperature detected by the temperature sensor changes to increase, and wherein the controller is configured to decrease the opening degree of the supercooling expansion valve when the controller recognizes that the temperature detected by the temperature sensor changes to decrease.

15. The water heater of claim 14, further comprising a supercooling temperature sensor installed in the condenser outlet pipe, wherein the controller is configured to calculate a supercooling degree based on a temperature of the supercooling temperature sensor when the controller recognizes that the temperature detected by the temperature sensor is higher than or equal to a reference temperature, and to perform control to close the supercooling expansion valve when the supercooling degree is greater than or equal to a predetermined supercooling degree.

* * * * *